United States Patent
Izumida et al.

(10) Patent No.: US 11,056,558 B2
(45) Date of Patent: Jul. 6, 2021

(54) SEMICONDUCTOR DEVICE AND SEMICONDUCTOR MEMORY DEVICE

(71) Applicant: Toshiba Memory Corporation, Tokyo (JP)

(72) Inventors: Takashi Izumida, Kanagawa (JP); Takeshi Shimane, Chiba (JP); Tadayoshi Uechi, Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 33 days.

(21) Appl. No.: 16/278,033

(22) Filed: Feb. 15, 2019

(65) Prior Publication Data
US 2020/0091292 A1    Mar. 19, 2020

(30) Foreign Application Priority Data
Sep. 14, 2018  (JP) .............................. JP2018-173114

(51) Int. Cl.
*H01L 29/08*    (2006.01)
*H01L 29/36*    (2006.01)
(Continued)

(52) U.S. Cl.
CPC .... *H01L 29/0847* (2013.01); *H01L 21/26506* (2013.01); *H01L 27/1157* (2013.01);
(Continued)

(58) Field of Classification Search
CPC ..... H01L 29/0847; H01L 29/36; H01L 29/78; H01L 29/1079; H01L 27/11573;
(Continued)

(56) References Cited

U.S. PATENT DOCUMENTS 7,666,771 B2    2/2010   Krull et al.
8,318,571 B2 *  11/2012  Lee ..................... H01L 21/2236
                                                     438/305
(Continued)

FOREIGN PATENT DOCUMENTS

JP    H05-190849       7/1993
JP    2014-160856 A    9/2014

OTHER PUBLICATIONS

Itokawa et al., "Contribution of Carbon to Growth of Boron-Containing Cluster in Heavily Boron-Doped Silicon", Japanese Journal of Applied Physics 49 (2010) 081301.
(Continued)

*Primary Examiner* — Eugene Lee
(74) *Attorney, Agent, or Firm* — Foley & Lardner LLP

(57) ABSTRACT

A semiconductor device according to an embodiment includes a semiconductor layer having a first plane and a second plane opposite to the first plane; a gate electrode; a gate insulating layer provided between the first plane and the gate electrode; and a pair of first p-type impurity regions provided in the semiconductor layer on both sides of the gate electrode, containing boron, carbon, and germanium, having a bond structure of boron and carbon, having a first boron concentration and a first depth in a direction from the first plane toward the second plane, and having a distance between the first p-type impurity regions being a first distance.

8 Claims, 9 Drawing Sheets

(51) Int. Cl.

| | |
|---|---|
| *H01L 29/78* | (2006.01) |
| *H01L 29/10* | (2006.01) |
| *H01L 27/11573* | (2017.01) |
| *H01L 21/265* | (2006.01) |
| *H01L 27/11582* | (2017.01) |
| *H01L 27/1157* | (2017.01) |
| *H01L 29/167* | (2006.01) |

(52) U.S. Cl.
CPC .. *H01L 27/11573* (2013.01); *H01L 27/11582* (2013.01); *H01L 29/1079* (2013.01); *H01L 29/167* (2013.01); *H01L 29/36* (2013.01); *H01L 29/78* (2013.01)

(58) Field of Classification Search
CPC ......... H01L 21/26506; H01L 27/11582; H01L 27/1157; H01L 29/167
See application file for complete search history.

(56) References Cited

U.S. PATENT DOCUMENTS

| | | | | |
|---|---|---|---|---|
| 2006/0234455 | A1* | 10/2006 | Chen | H01L 21/26506 438/276 |
| 2007/0096149 | A1* | 5/2007 | Liu | H01L 29/66636 257/192 |
| 2007/0284615 | A1* | 12/2007 | Ku | H01L 21/26506 257/196 |
| 2008/0067557 | A1* | 3/2008 | Yu | H01L 29/045 257/255 |
| 2015/0041916 | A1 | 2/2015 | Yu et al. | |
| 2015/0054030 | A1* | 2/2015 | Wang | H01L 21/26506 257/190 |

OTHER PUBLICATIONS

Shimizu et al., "Impact of carbon coimplantation on boron behavior in silicon: Carbon-boron coclustering and suppression of boron diffusion", Applied Physics Letters 98, 232101 (2011).

* cited by examiner

fab...

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2018-173114, filed on Sep. 14, 2018, the entire contents of which are incorporated herein by reference.

FIELD

Embodiments described herein relate generally to a semiconductor device and a semiconductor memory device.

BACKGROUND

In a p-type metal oxide field effect transistor (MOSFET), in order to shorten a gate length, it is required to make a p-type impurity region to be shallow. For example, in a p-type MOSFET using a silicon layer, there is a method of implanting carbon ions into the p-type impurity region in order to suppress diffusion of boron which is a p-type impurity. The carbon implanted into the silicon layer traps interstitial silicon, so that enhanced diffusion of boron caused by the interaction between boron and the interstitial silicon is suppressed. Therefore, a shallow p-type impurity region can be realized.

However, for example, when manufacturing a three-dimensional NAND flash memory in which a plurality of memory cells are three-dimensionally arranged, a long-term thermal process is required to form a plurality of memory cell arrays. Therefore, the p-type MOSFET formed prior to the memory cell array is subjected to a long-term thermal process. Therefore, diffusion of boron in the p-type impurity region of the p-type MOSFET is increased. Therefore, in the three-dimensional NAND flash memory, in order to realize a p-type MOSFET having a short gate length, it is desired to further suppress the diffusion of boron in p-type impurity region.

DETAILED DESCRIPTION

Figure 1:
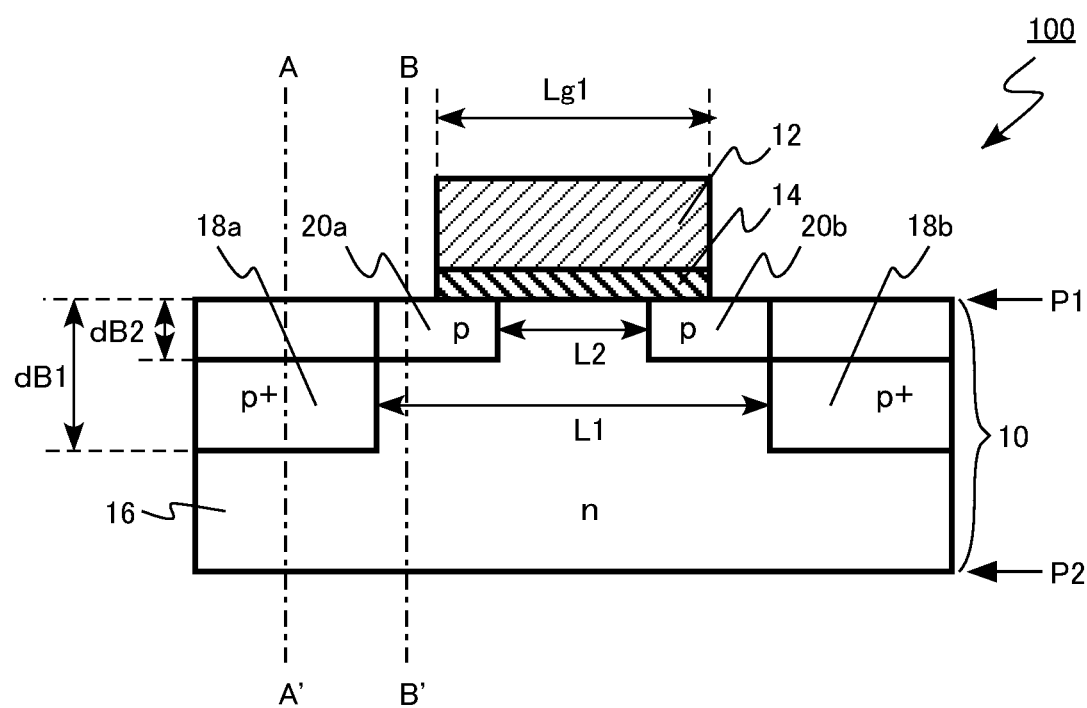
FIG. 1 is a schematic cross-sectional view of a semiconductor device according to a first embodiment.

A semiconductor device according to an embodiment includes: a semiconductor layer having a first plane and a second plane opposite to the first plane; a gate electrode; a gate insulating layer provided between the first plane and the gate electrode; and a pair of first p-type impurity regions provided in the semiconductor layer on both sides of the gate electrode, the first p-type impurity regions containing boron, carbon, and germanium, the first p-type impurity regions having a bond structure of boron and carbon, the first p-type impurity regions having a first boron concentration and a first depth in a direction from the first plane toward the second plane, and the first p-type impurity regions having a distance between the first p-type impurity regions being a first distance.

Hereinafter, embodiments of the invention will be described with reference to the drawings. In addition, the following description, the same or similar members or the like are denoted by the same reference numerals, and the description of the members or the like once described may be omitted as appropriate.

In the present specification, in some cases, the term "above" or "below" may be used for the convenience. The term "above" or "below" is a term indicating the relative positional relationship in the drawings and is not a term that defines a positional relationship on the basis of gravity.

In the present specification, in a case where there are notations of $n^+$-type, n-type, and $n^-$-type, these notations denote that the n-type impurity concentrations are lowered in the order of $n^+$-type, n-type and $n^-$-type. In addition, in a case where there are notations of $p^+$-type, p-type, and $p^-$-type, these notations denote that the p-type impurity concentrations are lowered in the order of $p^+$-type, p-type, and $p^-$-type.

In the present specification, an impurity concentration of a certain semiconductor region denotes, for example, the maximum impurity concentration of the semiconductor region.

First Embodiment

A semiconductor device according to a first embodiment includes a semiconductor layer having a first plane and a second plane opposite to the first plane, a gate electrode, a gate insulating layer provided between the first plane and the gate electrode, and a pair of first p-type impurity regions provided in the semiconductor layer on both sides of the gate electrode, the first p-type impurity regions containing boron, carbon, and germanium, the first p-type impurity regions having a bond structure of boron and carbon, the first p-type impurity regions having a first boron concentration and a first depth in a direction from the first plane toward the second plane, and the first p-type impurity regions having a distance between the first p-type impurity regions being a first distance.

FIG. 1 is a schematic cross-sectional view of the semiconductor device according to the first embodiment. The semiconductor device according to the first embodiment is a p-type MOSFET 100. The p-type MOSFET 100 is a transistor using holes as carriers.

The p-type MOSFET 100 includes a silicon layer 10 (semiconductor layer), a gate electrode 12, and a gate insulating layer 14. A substrate region 16 (n-type impurity region), a source/drain region 18a (first p-type impurity region), a source/drain region 18b (first p-type impurity region), an extension region 20a (second p-type impurity region), and an extension region 20b (second p-type impurity region) are provided in the silicon layer 10.

The silicon layer 10 has a first plane P1 and a second plane P2. The second plane P2 is opposite to the first plane P1. The first plane P1 is the front surface of the silicon layer 10, and the second plane P2 is the back surface of the silicon layer 10.

The silicon layer 10 is single crystal silicon, for example. For example, the first plane P1 is a plane having an off angle of 5 degrees or less with respect to the {100} plane of silicon.

The gate electrode 12 is a conductor. The gate electrode 12 is, for example, a semiconductor or a metal. The gate electrode 12 is, for example, polycrystalline silicon containing conductive impurities.

The gate electrode 12 has a first gate length (Lg1 in FIG. 1). The first gate length Lg1 is, for example, 40 nm or more and 170 nm or less.

The gate insulating layer 14 is, for example, an oxide or an oxynitride. The gate insulating layer 14 is, for example, a silicon oxide.

The substrate region 16 is n-type silicon. The substrate region 16 contains n-type impurities. The n-type impurity is, for example, phosphorus (P) or arsenic (As). The n-type impurity concentration of the substrate region 16 is, for example, $5 \times 10^{16}$ cm$^{-3}$ or more and $5 \times 10^{18}$ cm$^{-3}$ or less.

A portion of the substrate region 16 is provided between the source/drain region 18a and the source/drain region 18b. A portion of the substrate region 16 is provided between the extension region 20a and the extension region 20b. The substrate region 16 between the extension region 20a and the extension region 20b functions as a channel region of the p-type MOSFET 100.

For example, the carbon concentration in the substrate region 16 is lower than the carbon concentration in the source/drain region 18a and the source/drain region 18b.

The source/drain region 18a and the source/drain region 18b are a pair of p$^+$-type silicon regions. The source/drain region 18a and the source/drain region 18b are provided in the silicon layer 10 on both sides of the gate electrode 12.

The source/drain region 18a and the source/drain region 18b contain boron (B) as p-type impurities. The source/drain region 18a and the source/drain region 18b have a first boron concentration.

The first boron concentration is, for example, $1 \times 10^{19}$ cm$^{-3}$ or more and $1 \times 10^{22}$ cm$^{-3}$ or less.

The source/drain region 18a and the source/drain region 18b contain carbon (C) as impurities. The carbon concentration in the source/drain region 18a and the source/drain region 18b is, for example, $1 \times 10^{19}$ cm$^{-3}$ or more and $1 \times 10^{22}$ cm$^{-3}$ or less.

The source/drain region 18a and the source/drain region 18b contain germanium (Ge) as impurities. The germanium concentration of the source/drain region 18a and the source/drain region 18b is, for example, $5 \times 10^{19}$ cm$^{-3}$ or more and $1 \times 10^{22}$ cm$^{-3}$ or less.

The source/drain region 18a and the source/drain region 18b have boron-carbon clusters in which boron and carbon are localized. The boron-carbon clusters include the bond structure of boron and carbon. The bond structure between boron and carbon is, for example, a covalent bond between boron and carbon.

The source/drain region 18a and the source/drain region 18b have a first depth (dB1 in FIG. 1) in the direction from the first plane P1 toward the second plane P2. The first depth dB1 is the depth from the first plane P1 to the pn junction between the substrate region 16 and each of the source/drain region 18a and the source/drain region 18b. The first depth is, for example, 50 nm or more and 200 nm or less.

The distance between the source/drain region 18a and the source/drain region 18b is a first distance (L1 in FIG. 1). The first distance L1 is, for example, 50 nm or more and 300 nm or less.

The extension region 20a and the extension region 20b are a pair of p-type silicon regions. The extension region 20a and the extension region 20b are provided in the silicon layer 10 on both sides of the gate electrode 12.

The extension region 20a and the extension region 20b contain boron (B) as p-type impurities. The extension region 20a and the extension region 20b have a second boron concentration.

The second boron concentration is, for example, $1 \times 10^{18}$ cm$^{-3}$ or more and $1 \times 10^{20}$ cm$^{-3}$ or less.

The extension region 20a and the extension region 20b have a second depth (dB2 in FIG. 1) in the direction from the first plane P1 toward the second plane P2. The second depth dB2 is the depth from the first plane P1 to the pn junction between the substrate region 16 and each of the extension region 20a and the extension region 20b. The second depth dB2 is smaller than the first depth dB1. The second depth dB2 is, for example, 10 nm or more and 40 nm or less.

The distance between the extension region 20a and the extension region 20b is a second distance (L2 in FIG. 1). The second distance L2 is smaller than the first distance L1. The second distance L2 is, for example, 30 nm or more and 160 nm or less.

Figure 2A:
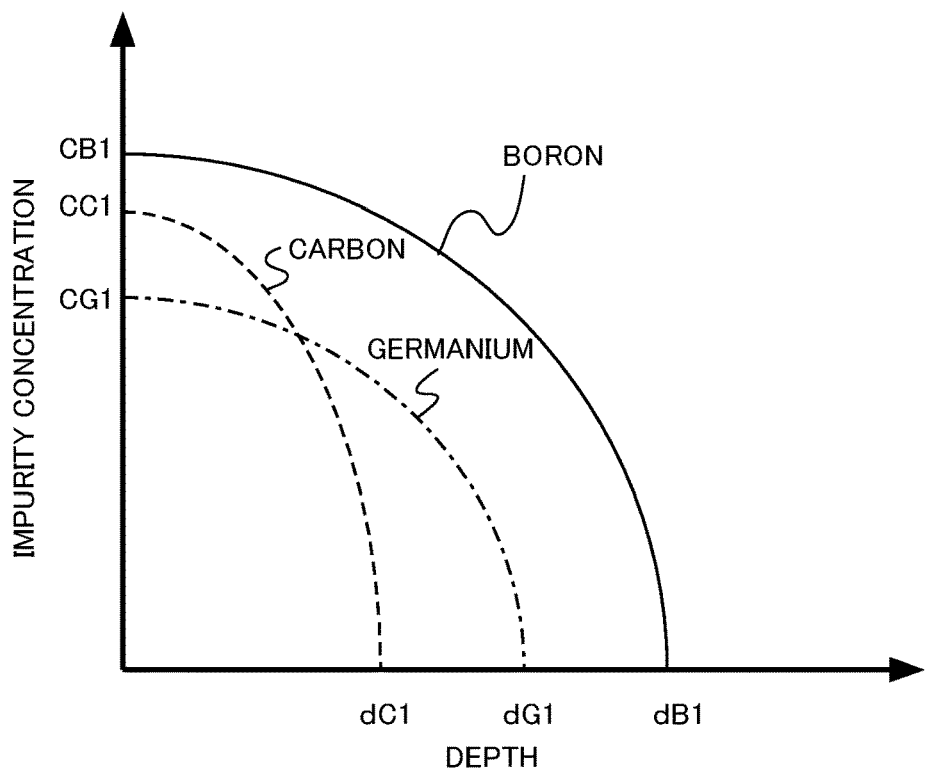
FIGS. 2A and 2B are explanatory diagrams of impurity concentration distributions of the semiconductor device according to the first embodiment.
Figure 2B:
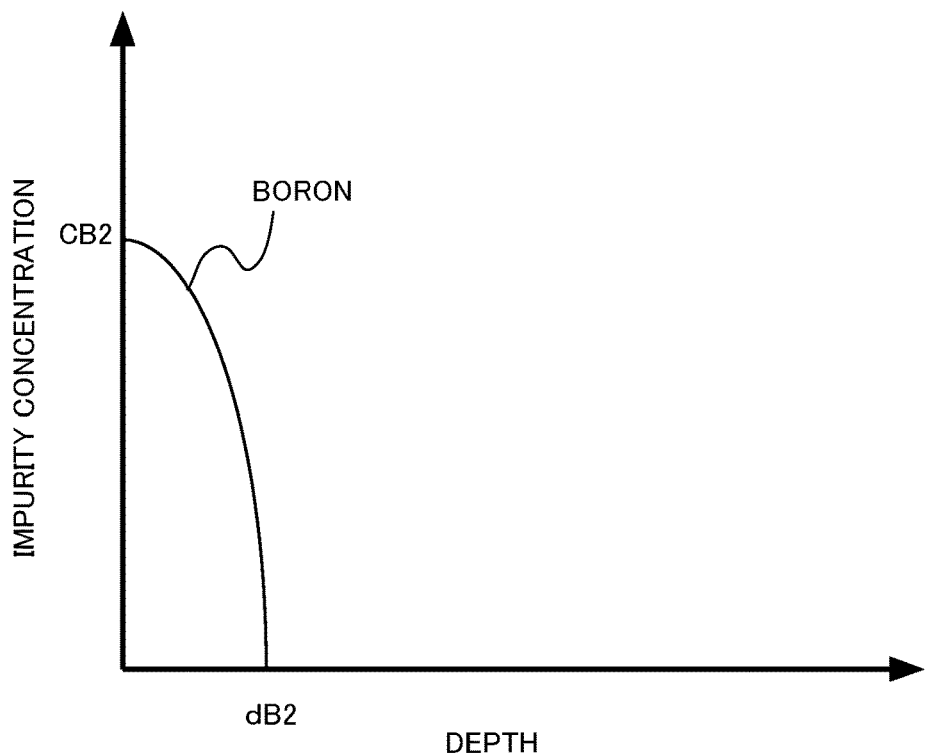

FIGS. 2A and 2B are explanatory diagrams of the impurity concentration distributions of the semiconductor device according to the first embodiment. FIG. 2A illustrates the impurity concentration distribution of the source/drain region 18a and the source/drain region 18b, and FIG. 2B illustrates the impurity concentration distribution of the extension region 20a and the extension region 20b. FIG. 2A is an impurity concentration distribution with the depth in the direction from the first plane P1 toward the second plane P2 along line A-A' in FIG. 1. FIG. 2B is an impurity concentration distribution with the depth in the direction from the first plane P1 toward the second plane P2 along line B-B' in FIG. 1.

FIG. 2A illustrates an example of the concentration distributions of boron, carbon, and germanium in the source/drain region 18a and the source/drain region 18b. Hereinafter, a region containing carbon is referred to as a carbon region, and a region containing germanium is referred to as a germanium region.

The depth of the carbon region (dC1 in FIG. 2A) is defined as, for example, the distance from the first plane P1 to the position where the carbon concentration is $1 \times 10^{17}$ cm$^{-3}$. The depth of the germanium region (dG1 in FIG. 2A)

is defined as, for example, the distance from the first plane P1 to the position where the germanium concentration is $1\times10^{17}$ cm$^{-3}$.

The depth dC1 of the carbon region is, for example, smaller than the first depth (dB1 in FIG. 2A) of the source/drain region 18a and the source/drain region 18b. The depth dG1 of the germanium region is, for example, smaller than the first depth dB1 of the source/drain region 18a and the source/drain region 18b. The depth dC1 of the carbon region is, for example, smaller than the depth dG1 of the germanium region.

The carbon concentration (CC1 in FIG. 2A) in the source/drain region 18a and the source/drain region 18b is, for example, lower than the first boron concentration (CB1 in FIG. 2A). In addition, the germanium concentration (CG1 in FIG. 2A) in the source/drain region 18a and the source/drain region 18b is, for example, lower than the first boron concentration CB1. In addition, the germanium concentration CG1 in the source/drain region 18a and the source/drain region 18b is, for example, lower than the carbon concentration CC1.

FIG. 2B illustrates an example of the concentration distribution of boron in the extension region 20a and the extension region 20b. The second depth dB2 of the extension region 20a and the extension region 20b is smaller than the first depth dB1 of the source/drain region 18a and the source/drain region 18b.

The second boron concentration (CB2 in FIG. 2B) in the extension region 20a and the extension region 20b is lower than the first boron concentration CB1.

The depth dC1 of the carbon region of the source/drain region 18a and the source/drain region 18b is, for example, larger than the second depth dB2 of the extension region 20a and the extension region 20b.

In addition, the impurity concentration in the silicon layer 10 can be measured by, for example, secondary ion mass spectrometry (SIMS). In addition, the magnitude relation of the impurity concentrations in the silicon layer 10, the position of the pn junction, the distance between the impurity regions, and the like can be measured by using, for example, a scanning capacitance microscope (SCM). In addition, the distance such as the gate length of the gate electrode 12 can be measured by using, for example, a transmission electron microscope (TEM). Determination as to whether or not the bond structure of boron and carbon is included in the source/drain region 18a and the source/drain region 18b can be performed by using, for example, X-ray photoelectron spectroscopy (XPS).

Next, an example of a method of manufacturing the semiconductor device according to the first embodiment will be described. FIGS. 3, 4, 5, 6, 7, and 8 are schematic cross-sectional views in the process of manufacturing the semiconductor device according to the first embodiment.

Figure 3:
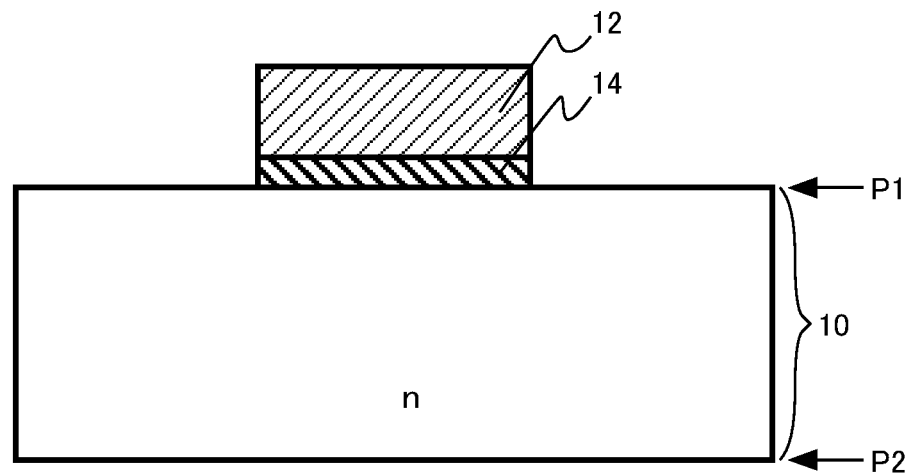
FIG. 3 is a schematic cross-sectional view in the process of manufacturing the semiconductor device according to the first embodiment.

First, the gate insulating layer 14 and the gate electrode 12 are formed on the first plane P1 of the silicon layer 10 having the first plane P1 and the second plane P2 by using a known process technique (FIG. 3).

Figure 4:
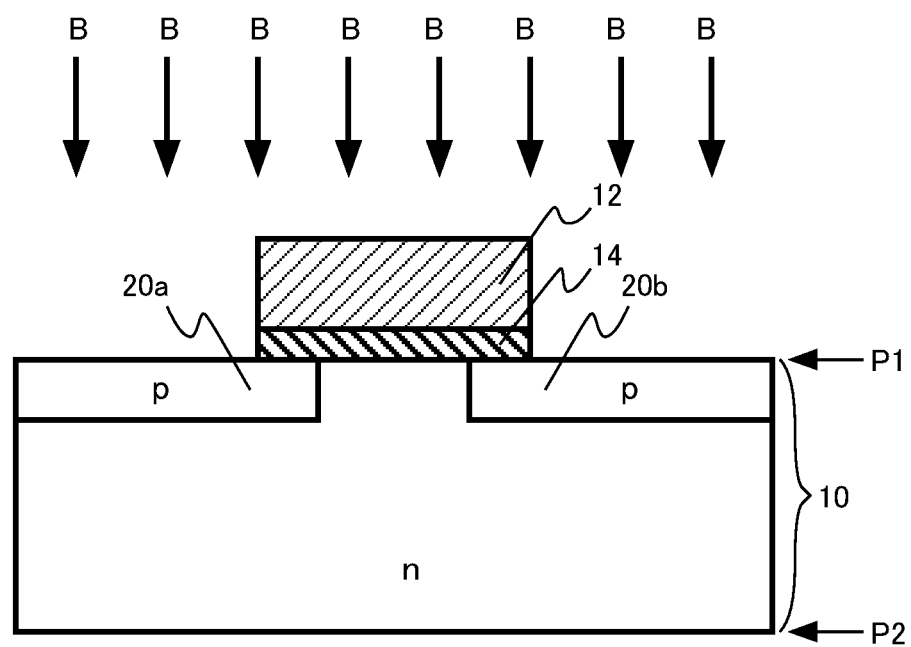
FIG. 4 is a schematic cross-sectional view in the process of manufacturing the semiconductor device according to the first embodiment.

Next, boron (B) ions are implanted into the silicon layer 10 by an ion implantation method by using the gate electrode 12 as a mask. Due to the implanted boron, the extension region 20a and the extension region 20b are formed (FIG. 4).

Figure 5:
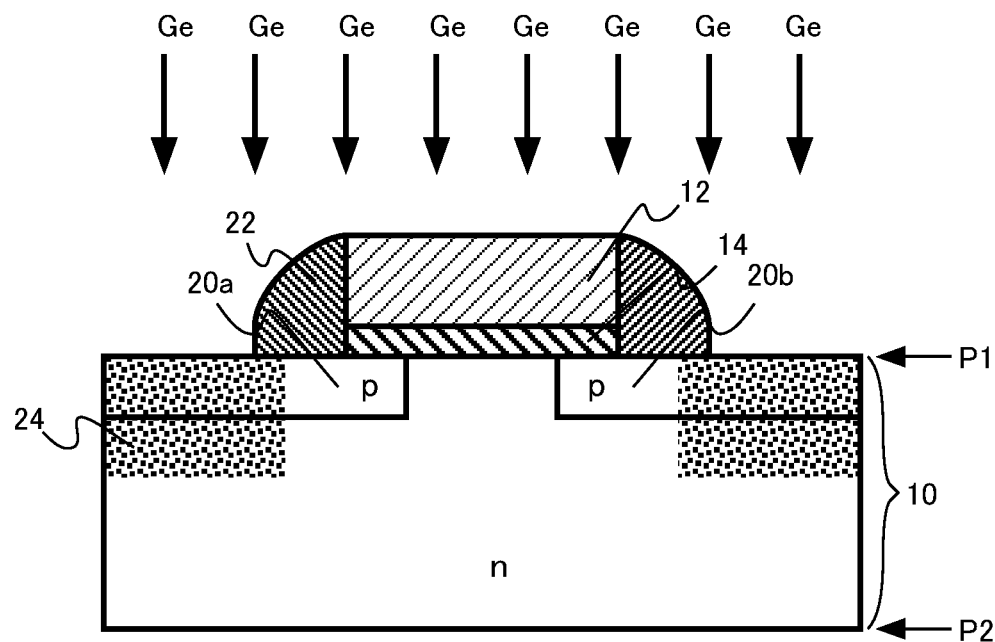
FIG. 5 is a schematic cross-sectional view in the process of manufacturing the semiconductor device according to the first embodiment.

Next, sidewalls 22 are formed on both side surfaces of the gate electrode 12 by using a known process technique. The sidewall 22 is, for example, silicon nitride. Next, germanium (Ge) ions are implanted into the silicon layer 10 by an ion implantation method by using the gate electrode 12 and the sidewall 22 as a mask. By implanting germanium, a portion of the single crystal silicon layer 10 is amorphized, and thus, an amorphous region 24 containing germanium is formed (FIG. 5).

In addition, it is also possible to amorphize a portion of the single crystal silicon layer 10 by implanting ions of, for example, silicon (Si) or argon (Ar) instead of germanium.

Figure 6:
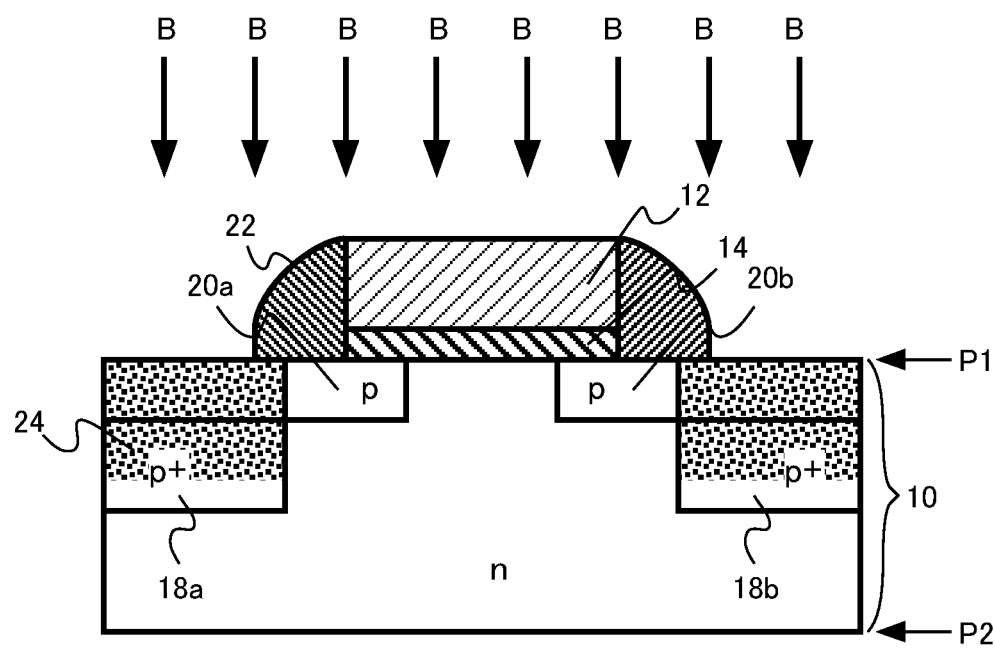
FIG. 6 is a schematic cross-sectional view in the process of manufacturing the semiconductor device according to the first embodiment.

Next, boron (B) ions are implanted into the silicon layer 10 by an ion implantation method by using the gate electrode 12 and the sidewall 22 as a mask. Due to the implanted boron, the source/drain region 18a and the source/drain region 18b are formed (FIG. 6).

Figure 7:
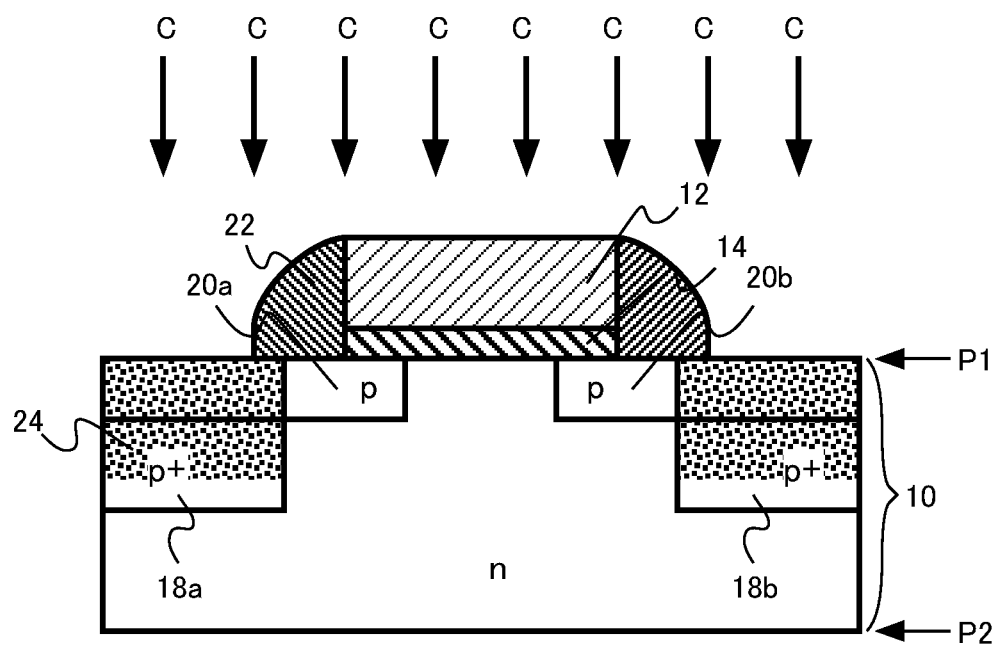
FIG. 7 is a schematic cross-sectional view in the process of manufacturing the semiconductor device according to the first embodiment.

Next, carbon (C) ions are implanted into the silicon layer 10 by an ion implantation method by using the gate electrode 12 and the sidewall 22 as a mask (FIG. 7).

Figure 8:
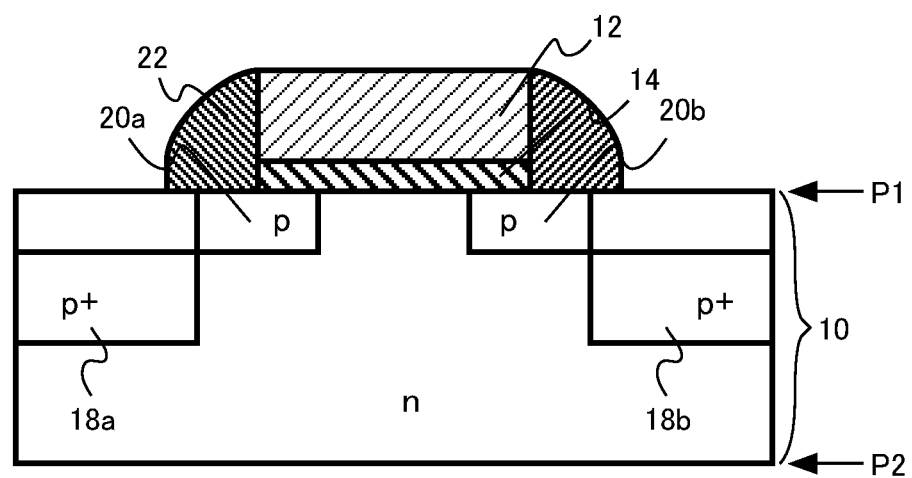
FIG. 8 is a schematic cross-sectional view in the process of manufacturing the semiconductor device according to the first embodiment.

Next, heat treatment is performed to recrystallize the amorphous region 24. The heat treatment is performed by spike annealing, for example, at 900° C. or more and 1100° C. or less. When the amorphous region 24 is recrystallized, the boron-carbon clusters including the bond structure of boron and carbon are formed in the source/drain region 18a and the source/drain region 18b (FIG. 8).

After that, by removing the sidewall 22, it is possible to manufacture the p-type MOSFET 100 illustrated in FIG. 1. In addition, it is also possible to allow the sidewall 22 to remain as the structure of the p-type MOSFET 100 without removing the sidewall 22.

Next, the functions and effects of the semiconductor device according to the first embodiment will be described.

In the p-type MOSFET, in order to scale down the gate length, it is required to make the p-type impurity region to be shallow. In a p-type MOSFET using a silicon layer, there is a method of implanting carbon ions into the p-type impurity region containing boron. According to this method, enhanced diffusion of boron caused by interaction between boron and interstitial silicon can be suppressed. Therefore, the p-type impurity region can be made shallow. Accordingly, the gate length of the p-type MOSFET can be shortened.

However, for example, when manufacturing a three-dimensional NAND flash memory in which a plurality of memory cells are three-dimensionally arranged, a long-term thermal process is required to form a plurality of memory cell arrays. Therefore, the p-type MOSFET formed prior to the memory cell array is subjected to a long-term thermal process. Therefore, in the three-dimensional NAND flash memory, for example, even if the enhanced diffusion of boron is suppressed, the p-type impurity region may be deepened by intrinsic diffusion of boron. Accordingly, in the three-dimensional NAND flash memory, in order to realize a p-type MOSFET having a short gate length, it is desired to further suppress the diffusion of boron.

The p-type MOSFET 100 according to the first embodiment has boron-carbon clusters including a bond structure of boron and carbon in the source/drain region 18a and the source/drain region 18b. The boron-carbon clusters suppress the enhanced diffusion of boron. In addition, the boron-carbon cluster of the p-type MOSFET 100 also suppresses intrinsic diffusion of boron by including the bond structure of boron and carbon. Therefore, even if a long-term thermal process is performed after the source/drain region 18a, the source/drain region 18b, the extension region 20a and the extension region 20b are formed, the depths of the source/drain region 18a, the source/drain region 18b, the extension region 20a, and the extension region 20b can be maintained to be small. In addition, the first distance L1 between the source/drain region 18a and the source/drain region 18b can be maintained to be long. In addition, the second distance L2 between the extension region 20a and the extension region 20b can be maintained to be long. Accordingly, it is possible to realize the p-type MOSFET 100 having the short first gate length Lg1.

Since the boron-carbon cluster contains the bond structure of boron and carbon, a portion of the borons in the source/drain region 18a and the source/drain region 18b becomes inactive. Since a portion of the borons becomes inactive, the practical boron concentration gradient of the p-type impurity region is relaxed. It is considered that the relaxation of the practical boron concentration gradient suppresses the intrinsic diffusion of boron.

The boron-carbon cluster including the bond structure of boron and carbon can be formed by recrystallizing the amorphized silicon layer 10 containing high concentration boron and high concentration of carbon.

The first boron concentration CB1 in the source/drain region 18a and the source/drain region 18b is preferably $1 \times 10^{19}$ cm$^{-3}$ or more and $1 \times 10^{22}$ cm$^{-3}$ or less and more preferably $1 \times 10^{20}$ cm$^{-3}$ or more and $5 \times 10^{21}$ cm$^{-3}$ or less. If the first boron concentration falls below the above-mentioned range, the bond structure of boron and carbon may not be formed.

The carbon concentration CC1 in the source/drain region 18a and the source/drain region 18b is preferably $1 \times 10^{19}$ cm$^{-3}$ or more and $1 \times 10^{22}$ cm$^{-3}$ or less and more preferably $1 \times 10^{20}$ cm$^{-3}$ or more and $5 \times 10^{21}$ cm$^{-3}$ or less. If the carbon concentration falls below the above-mentioned range, the bond structure of boron and carbon may not be formed. If the carbon concentration exceeds the above-mentioned range, crystal defects in the silicon layer 10 increase, and thus, there is a concern that the leakage current of the pn junction may increase.

The germanium concentration CG1 in the source/drain region 18a and the source/drain region 18b is preferably $5 \times 10^{19}$ cm$^{-3}$ or more and $1 \times 10^{22}$ cm$^{-3}$ or less and more preferably $5 \times 10^{19}$ cm$^{-3}$ or more and $1 \times 10^{21}$ cm$^{-3}$ or less. If the germanium concentration falls below the above-mentioned range, the amorphization of the silicon layer 10 becomes insufficient, and thus, there is a concern that the bond structure of boron and carbon may not be formed. If the germanium concentration exceeds the above-mentioned range, crystal defects in the silicon layer 10 increase, and thus, there is a concern that the leakage current of the pn junction may increase.

From the viewpoint of suppressing the crystal defects in the silicon layer 10, it is preferable that the germanium concentration CG1 in the source/drain region 18a and the source/drain region 18b is low.

It is preferable that the carbon concentration in the substrate region 16 between the source/drain region 18a and the source/drain region 18b and in the substrate region 16 between the extension region 20a and the extension region 20b is low. It is preferable that the carbon concentration in the substrate region 16 between the source/drain region 18a and the source/drain region 18b and in the substrate region 16 between the extension region 20a and the extension region 20b is lower than the carbon concentration in the source/drain region 18a and the source/drain region 18b. The carbon concentration in the substrate region 16 between the source/drain region 18a and the source/drain region 18b and in the substrate region 16 between the extension region 20a and the extension region 20b is preferably $1 \times 10^{17}$ cm$^{-3}$ or less, more preferably $1 \times 10^{16}$ cm$^{-3}$ or less, and further more preferably $1 \times 10^{15}$ cm$^{-3}$ or less.

If the carbon concentration in the substrate region 16 between the source/drain region 18a and the source/drain region 18b and in the substrate region 16 between the extension region 20a and the extension region 20b is high, there is a concern that the carrier mobility of the p-type MOSFET decreases.

It is preferable that the depth dC1 of the carbon region is smaller than the first depth dB1 of the source/drain region 18a and the source/drain region 18b. It is possible to efficiently use the carbon implanted into the silicon layer 10 for the bond structure of boron and carbon.

It is preferable that the depth dG1 of the germanium region is smaller than the first depth dB1 of the source/drain region 18a and the source/drain region 18b. The formation of crystal defects due to germanium in the vicinity of the pn junction is suppressed, and thus, an increase in the leakage current of the pn junction is suppressed.

It is preferable that the depth dC1 of the carbon region is smaller than the depth dG1 of the germanium region. It is possible to efficiently utilize the carbon implanted into the silicon layer 10 in the bond structure of boron and carbon at the time of the recrystallization of the silicon layer 10.

It is preferable that the depth dC1 of the carbon regions of the source/drain region 18a and the source/drain region 18b is larger than the second depth dB2 of the extension region 20a and the extension region 20b. It is possible to further suppress the diffusion of boron in the extension region 20a and the extension region 20b.

As described above, according to the p-type MOSFET according to the first embodiment, the diffusion of boron can be suppressed by having the bond structure of boron and carbon. Therefore, the p-type MOSFET having a short gate length is realized.

Second Embodiment

A semiconductor memory device according to a second embodiment includes a semiconductor layer having a first plane and a second plane opposite to the first plane, a memory cell array provided on the first plane and including a plurality of memory cells, and a first transistor including a first gate electrode, a first gate insulating layer provided between the first plane and the first gate electrode, and a pair of first p-type impurity regions provided in the semiconductor layer on both sides of the first gate electrode, containing boron, carbon, and germanium, having a bond structure of boron and carbon, having a first boron concentration and a first depth in a direction from the first plane toward the second plane, having a distance between the first p-type impurity regions being the first distance.

The semiconductor memory device according to the second embodiment is a semiconductor memory device including the semiconductor device according to the first embodiment. Hereinafter, with respect to the same contents as those of the first embodiment, a portion of the description may be omitted.

The semiconductor memory device according to the second embodiment is a three-dimensional NAND flash memory in which a plurality of memory cells are three-dimensionally arranged.

Figure 9:
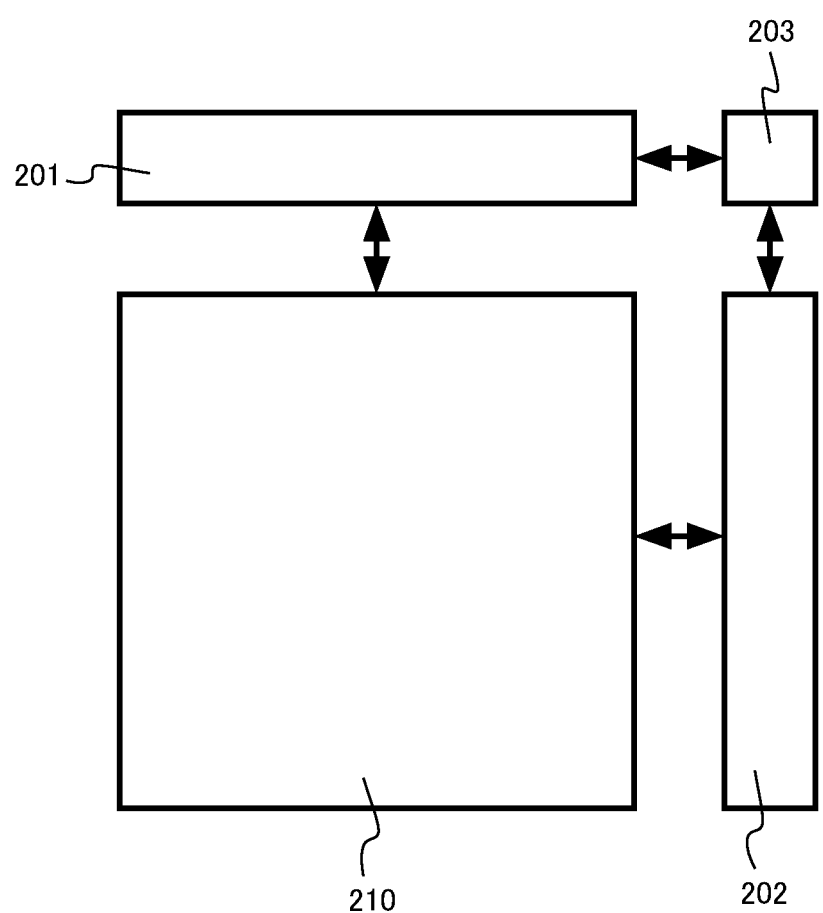
FIG. 9 is a block diagram of a semiconductor memory device according to a second embodiment.
Figure 10:
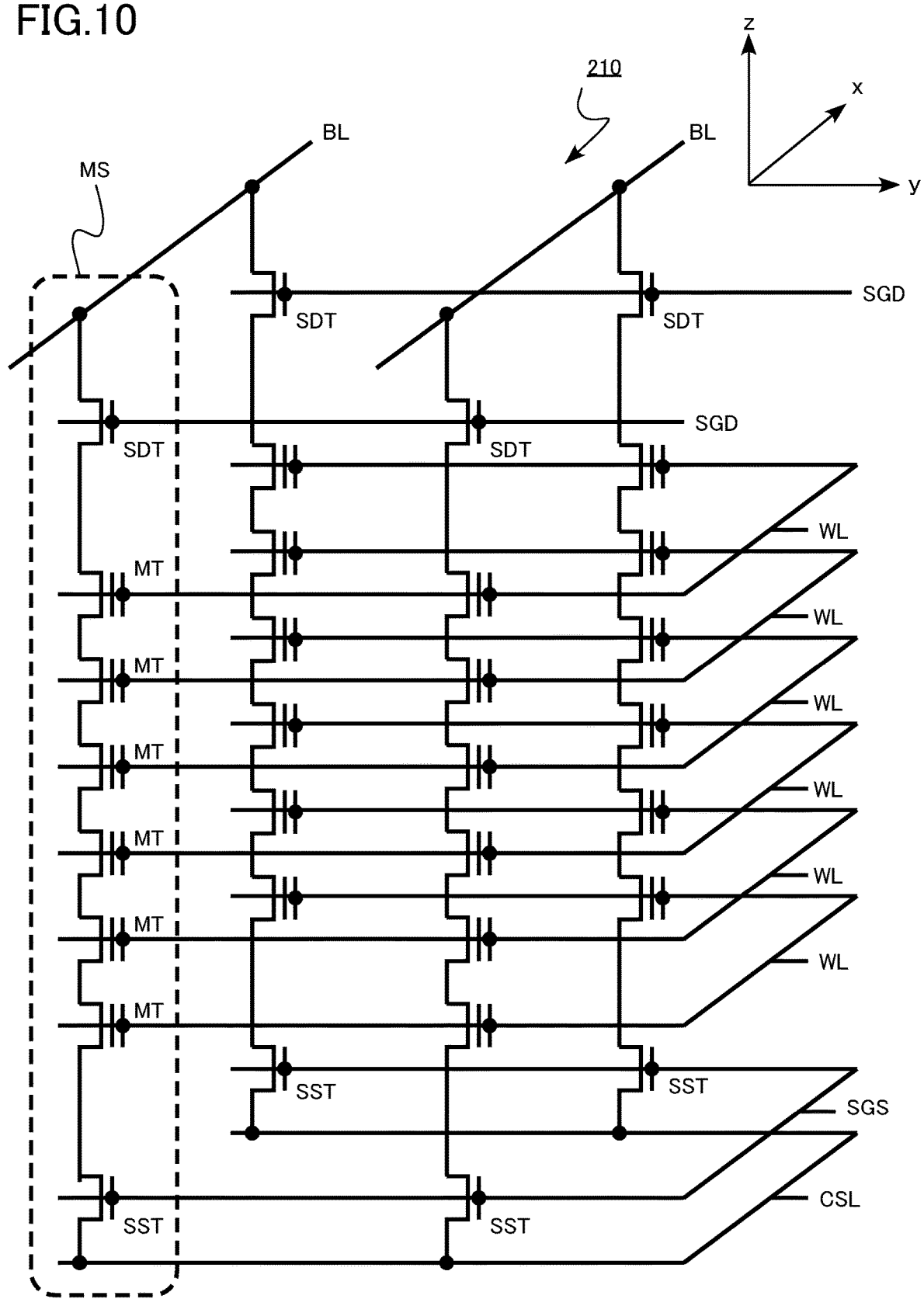
FIG. 10 is a circuit diagram of a memory cell array of the semiconductor memory device according to the second embodiment.
Figure 11:
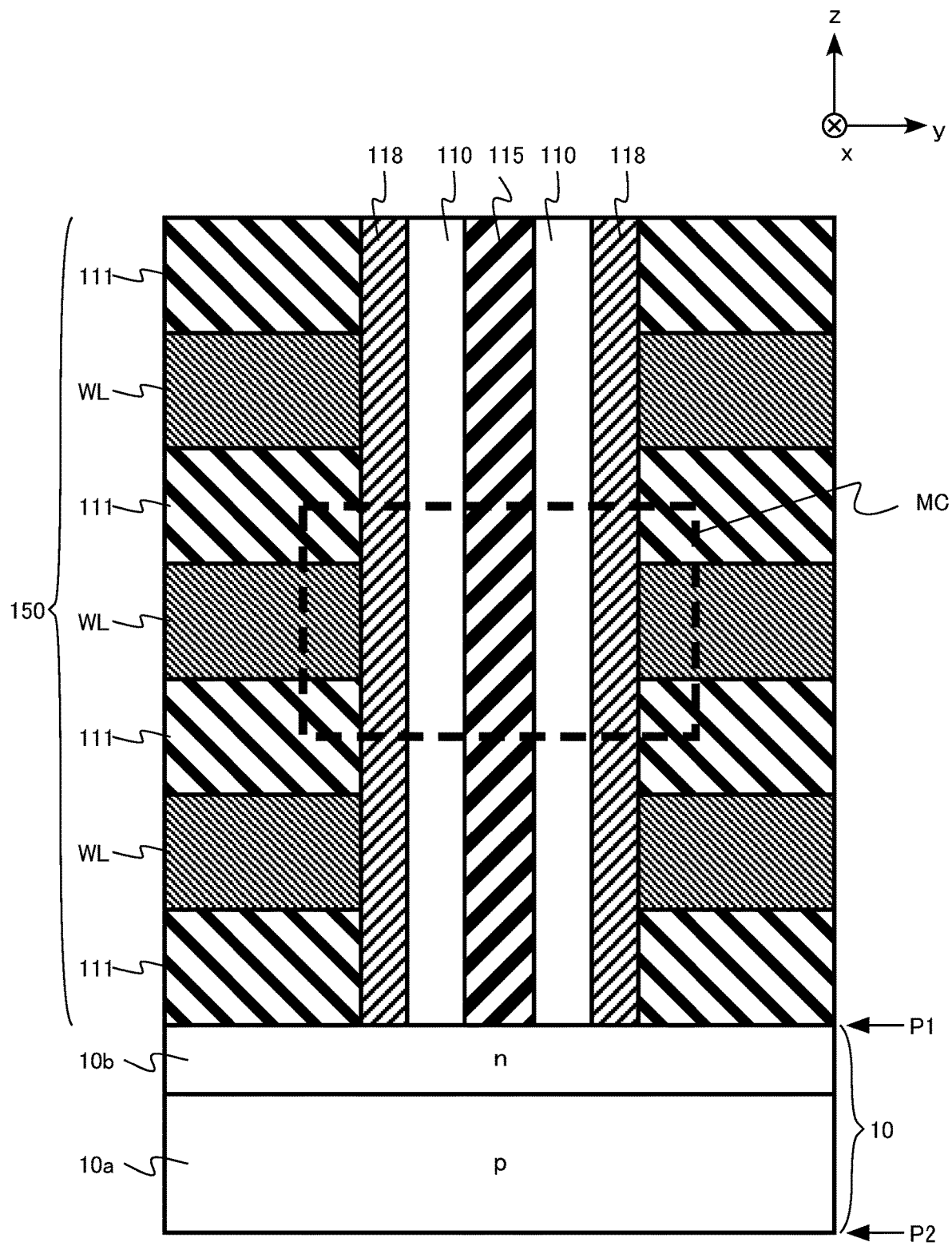
FIG. 11 is a schematic cross-sectional view of a memory string of the semiconductor memory device according to the second embodiment.

FIG. 9 is a block diagram of the semiconductor memory device according to the second embodiment. FIG. 10 is a circuit diagram of a memory cell array of the semiconductor memory device according to the second embodiment. FIG. 11 is a schematic cross-sectional view of a memory string of the semiconductor memory device according to the second embodiment. FIG. 11 illustrates a cross section of a plurality of memory cell transistors MT in one memory string MS surrounded by, for example, a dotted line in the memory cell array 210 of FIG. 10. In FIG. 11, the region surrounded by the dotted line corresponds to one memory cell MC and includes one memory cell transistor MT.

The three-dimensional NAND flash memory includes a memory cell array 210, a first peripheral circuit 201, a second peripheral circuit 202, and a control circuit 203.

As illustrated in FIG. 10, the memory cell array 210 of the three-dimensional NAND flash memory according to the second embodiment includes a plurality of word lines WL, a common source line CSL, a source selection gate line SGS, a plurality of drain selection gate lines SGD, a plurality of bit lines BL, and a plurality of memory strings MS. In FIG. 10, the x direction, the y direction, and the z direction are directions perpendicular to each other. The three-dimensional NAND flash memory according to the second embodiment has a so-called bit-cost scalable (BiCS) structure.

As illustrated in FIG. 10, the memory string MS includes a source selection transistor SST, a plurality of memory cell transistors MT, and a drain selection transistor SDT connected in series between the common source line CSL and the bit line BL. One memory string MS can be selected by the bit line BL and the drain selection gate line SGD, and one memory cell transistor MT can be selected by the word line WL.

As illustrated in FIG. 11, the memory cell array 210 is formed on the silicon layer 10. The silicon layer 10 has a first plane P1 and a second plane P2. The memory cell array 210 is provided on the first plane P1. The silicon layer 10 includes a p-type region 10a and an n-type region 10b.

The memory cell array 210 includes a plurality of word lines WL, a semiconductor channel layer 110, a plurality of interlayer insulating layers 111, a core insulating layer 115, and a charge storage layer 118. A plurality of word lines WL and a plurality of interlayer insulating layers 111 constitute a stacked body 150.

The word lines WL and the interlayer insulating layers 111 are alternately stacked on the silicon layer 10 in the z direction. The plurality of word lines WL and the plurality of interlayer insulating layers 111 constitute the stacked body 150.

The word line WL is a plate-shaped conductor. The word line WL is, for example, a metal or a semiconductor. The word line WL is, for example, tungsten (W). The word line WL functions as a control electrode of the memory cell transistor MT. The word line WL is a gate electrode layer.

The interlayer insulating layer 111 separates the word line WL and the word line WL. The interlayer insulating layer 111 is, for example, a silicon oxide.

The core insulating layer 115 is provided in the stacked body 150. The core insulating layer 115 extends in the z direction. The core insulating layer 115 is provided penetrating the stacked body 150. The core insulating layer 115 is surrounded by the semiconductor channel layer 110. The core insulating layer 115 is, for example, a silicon oxide.

The semiconductor channel layer 110 is provided in the stacked body 150. The semiconductor channel layer 110 extends in the z direction. The semiconductor channel layer 110 is provided penetrating the stacked body 150. The semiconductor channel layer 110 is provided around the core insulating layer 115. The semiconductor channel layer 110 has, for example, a cylindrical shape.

The semiconductor channel layer 110 is, for example, polycrystalline silicon. The semiconductor channel layer 110 functions as a channel of the memory cell transistor MT.

The charge storage layer 118 is provided between the semiconductor channel layer 110 and the word line WL. The charge storage layer 118 has a function of accumulating charges.

The charge storage layer 118 has a stacked structure of, for example, a silicon oxide, a silicon nitride, and a silicon oxide.

The memory cell transistor MT includes a word line WL, a charge storage layer 118, and a semiconductor channel layer 110. The memory cell transistor MT has a function of retaining data based on the level of the charge amount accumulated in the charge storage layer 118.

The data retained in the memory cell transistor MT is, for example, a threshold voltage of the memory cell transistor MT according to the level of the charge amount accumulated in the charge storage layer 118. The memory cell transistor MT can store data having two or more values by using, for example, different threshold voltages.

The bit line BL is electrically connected to the semiconductor channel layer 110. The bit line BL has a function of transmitting data read from the memory cell transistor MT. In addition, the bit line BL has a function of transmitting data to be written to the memory cell transistor MT. The bit line BL is, for example, a metal.

The source selection transistor SST has a function of selecting the memory string MS on the basis of the signal applied to the source selection gate line SGS. The drain selection transistor SDT has a function of selecting the memory string MS on the basis of the signal applied to the drain selection gate line SGD.

For example, a ground potential is applied to the common source line CSL.

The first peripheral circuit 201 is connected to a plurality of the word lines WL. The first peripheral circuit 201 has a function of selecting a desired word line WL. The first peripheral circuit 201 has a function of applying a commanded voltage to the selected word line WL.

The second peripheral circuit 202 is connected to the plurality of bit lines BL. The second peripheral circuit 202 has a function of selecting a desired bit line BL. The second peripheral circuit 202 has a function of sensing data of the memory cell transistor MT read from the selected bit line BL. In addition, the second peripheral circuit 202 has a function of transferring data to be written in the memory cell transistor MT to the selected bit line BL. The second peripheral circuit 202 includes, for example, a sense amplifier circuit.

The control circuit 203 controls the operations of the first peripheral circuit 201 and the operations of the second peripheral circuit 202. The control circuit 203 has a function of causing the first peripheral circuit 201 and the second peripheral circuit 202 to execute a write sequence, a read sequence, and an erase sequence for the memory cell transistor MT.

The control circuit 203 includes, for example, a voltage generation circuit, an input/output circuit, and the like.

Figure 12A:
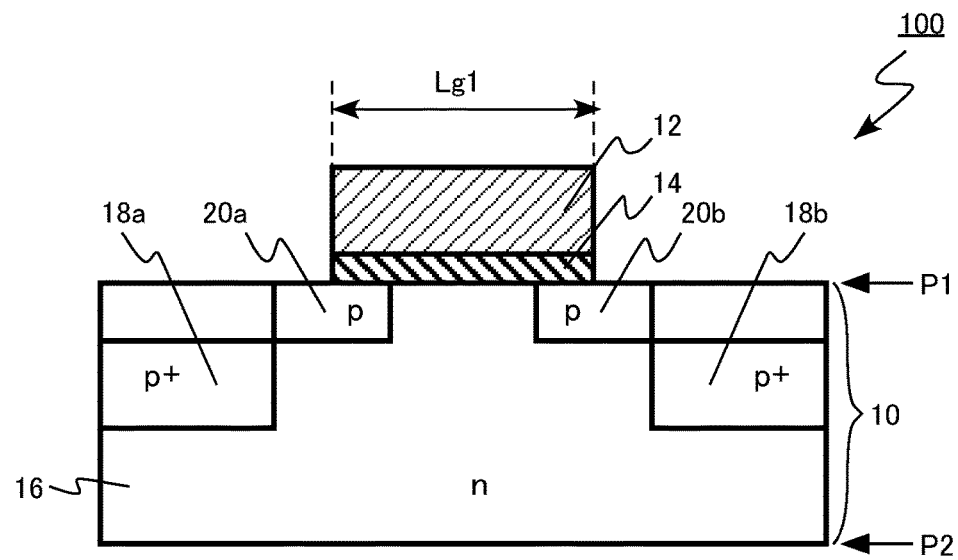
FIGS. 12A and 12B are schematic cross-sectional views of p-type MOSFETs included in the semiconductor memory device according to the second embodiment.
Figure 12B:
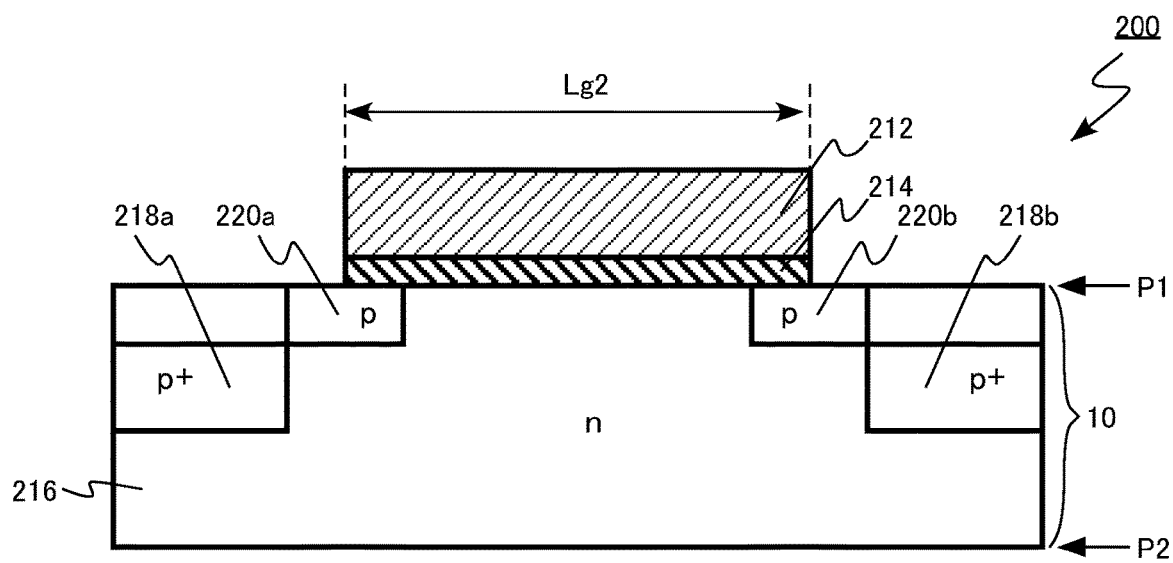

FIGS. 12A and 12B are schematic cross-sectional views of p-type MOSFETs included in the semiconductor memory device according to the second embodiment. FIG. 12A illustrates a first p-type MOSFET 100 (first transistor). FIG. 12B illustrates a second p-type MOSFET 200 (second transistor).

The first p-type MOSFET 100 is provided, for example, in the first peripheral circuit 201 or the second peripheral circuit 202. The first p-type MOSFET 100 has a structure similar to that of the p-type MOSFET 100 according to the first embodiment.

The first p-type MOSFET 100 includes a silicon layer 10 (semiconductor layer), a gate electrode 12 (first gate electrode), and a gate insulating layer 14 (first gate insulating layer). A substrate region 16, a source/drain region 18a (first p-type impurity region), a source/drain region 18b (first p-type impurity region), an extension region 20a (second p-type impurity region), and an extension region 20b (second p-type impurity region) are provided in the silicon layer 10.

The gate electrode 12 of the first p-type MOSFET 100 has a first gate length (Lg1 in FIG. 12A).

The second p-type MOSFET 200 is provided, for example, in the control circuit 203.

The second p-type MOSFET 200 includes a silicon layer 10 (semiconductor layer), a gate electrode 212 (second gate electrode), and a gate insulating layer 214 (second gate insulating layer). A substrate region 216, a source/drain region 218a (third p-type impurity region), a source/drain region 218b (third p-type impurity region), an extension region 220a, and an extension region 220b are provided in the silicon layer 10.

The gate electrode 212 of the second p-type MOSFET 200 has a second gate length (Lg2 in FIG. 12B). The second gate length Lg2 is larger than the first gate length Lg1.

The configuration of the source/drain region 218a and the source/drain region 218b of the second p-type MOSFET 200 is different from that of the source/drain region 18a and the source/drain region 18b of the first p-type MOSFET 100.

The source/drain region 218a and the source/drain region 218b are a pair of silicon regions. The source/drain region 218a and the source/drain region 218b are provided in the silicon layer 10 on both sides of the gate electrode 212.

The source/drain region 218a and the source/drain region 218b contain boron (B) as p-type impurities. The boron concentration of the source/drain region 218a and the source/drain region 218b is, for example, $5 \times 10^{19}$ cm$^{-3}$ or more and $1 \times 10^{22}$ cm$^{-3}$ or less.

The carbon concentration in the source/drain region 218a and the source/drain region 218b is lower than the carbon concentration in the source/drain region 18a and the source/drain region 18b of the first p-type MOSFET 100. The carbon concentration of the source/drain region 218a and the source/drain region 218b is, for example, $1 \times 10^{17}$ cm$^{-3}$ or less.

The germanium concentration of the source/drain region 218a and the source/drain region 218b is lower than the germanium concentration of the source/drain region 18a and the source/drain region 18b of the first p-type MOSFET 100. The germanium concentration of the source/drain region 218a and the source/drain region 218b is, for example, $1 \times 10^{17}$ cm$^{-3}$ or less.

The amount of bond structure between boron and carbon in the source/drain region 218a and the source/drain region 218b is smaller than the amount of bond structure between boron and carbon in the source/drain region 18a and the source/drain region 18b of the first p-type MOSFET 100.

For example, when manufacturing the second p-type MOSFET 200, ion implantation of germanium and carbon is not performed. Therefore, it is possible to prevent the boron-carbon clusters containing the bond structure of boron and carbon from being formed in the source/drain region 218a and the source/drain region 218b.

In addition, for example, when manufacturing the second p-type MOSFET 200, similarly to the first p-type MOSFET 100, carbon ion implantation is performed. Then, germanium ion implantation is not performed. Therefore, it is possible to prevent the boron-carbon clusters containing the bond structure of boron and carbon from being formed in the source/drain region 218a and the source/drain region 218b. On the other hand, the enhanced diffusion of boron is suppressed by the ion-implanted carbon.

In addition, the magnitude relationship between the amounts of the bond structures of boron and carbon can be determined by, for example, X-ray photoelectron spectroscopy (XPS).

Next, the functions and effects of the semiconductor memory device according to the second embodiment will be described.

The three-dimensional NAND flash memory according to the second embodiment includes a first p-type MOSFET 100 having a bond structure of boron and carbon in the source/drain region 18a and the source/drain region 18b. Since the first p-type MOSFET 100 has a bond structure of boron and carbon, even though a long-term thermal process for forming the memory cell array 210 after forming the p-type MOSFET 100 is performed, diffusion of boron is suppressed. Therefore, the gate length Lg1 of the first p-type MOSFET 100 can be shortened. Accordingly, it is possible to reduce the chip size of the three-dimensional NAND flash memory and to realize fast operation of the MOSFET.

In the first peripheral circuit 201 and the second peripheral circuit 202 of the three-dimensional NAND flash memory according to the second embodiment, a large number of transistors are required to be densely arranged in terms of the functions. On the other hand, the transistors of the control circuit 203 are not required to be densely arranged, and the transistors having relatively large gate lengths and gate widths are arranged. For example, in the transistor of the control circuit 203, since a high voltage may be arranged in the pn junction in some cases, and thus, suppression of the leakage current of the pn junction is required.

In the three-dimensional NAND flash memory according to the second embodiment, for example, a first p-type MOSFET 100 capable of shortening the gate length Lg1 is applied to the first peripheral circuit 201 or the second peripheral circuit 202. Therefore, it is possible to reduce the area of the first peripheral circuit 201 or the second peripheral circuit 202.

Therefore, reduction in chip size of the three-dimensional NAND flash memory can be implemented.

On the other hand, for example, a second p-type MOSFET 200 in which crystal defects due to the process for forming a bond structure of boron and carbon do not occurs is applied to the control circuit 203. Therefore, the leakage current of the pn junction in the control circuit 203 is suppressed. Therefore, the performance of the three-dimensional NAND flash memory is improved.

As described above, according to the three-dimensional NAND flash memory according to the second embodiment, a three-dimensional NAND flash memory with small chip size and improved performance is realized.

In the second embodiment, the case where the semiconductor memory device is a three-dimensional NAND flash memory has been described as an example, but the present invention can also be applied to other semiconductor memories such as a two-dimensional NAND flash memory and a dynamic random access memory.

While certain embodiments have been described, these embodiments have been presented by way of example only, and are not intended to limit the scope of the inventions. Indeed, a semiconductor device and a semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer having a first face and a second face opposite to the first face;
a gate electrode;
a gate insulating layer provided between the first face and the gate electrode;
a pair of first p-type impurity regions provided in the semiconductor layer on both sides of the gate electrode, the first p-type impurity regions containing boron, carbon, and germanium, the first p-type impurity regions having a bond structure of boron and carbon, the first p-type impurity regions having a first boron concentration and a first depth in a direction from the first face toward the second face, the first p-type impurity regions having a distance between the first p-type impurity regions being a first distance, and each of the first p-type impurity regions including a portion having a carbon concentration higher than a germanium concentration; and
a pair of second p-type impurity regions provided in the semiconductor layer on both sides of the gate electrode, the second p-type impurity regions containing boron, the second p-type impurity regions having a second boron concentration lower than the first boron concentration, the second p-type impurity regions having a second depth smaller than the first depth in the direction from the first face toward the second face, the second p-type impurity regions having a distance between the second p-type impurity regions being a second distance shorter than the first distance, and the second p-type impurity regions having a germanium concentration lower than the germanium concentration of the first p-type impurity regions.

2. The semiconductor device according to claim 1, wherein a depth of a region containing carbon in the first p-type impurity regions in the direction from the first face toward the second face is larger than the second depth.

3. The semiconductor device according to claim 1, wherein the first boron concentration is $1\times10^{19}$ cm$^{-3}$ or more and $1\times10^{22}$ cm$^{-3}$ or less.

4. The semiconductor device according to claim 1, wherein the carbon concentration of the portion is $1\times10^{19}$ cm$^{-3}$ or more and $1\times10^{22}$ cm$^{-3}$ or less.

5. The semiconductor device according to claim 1, wherein a germanium concentration of the first p-type impurity regions is $5\times10^{19}$ cm$^{-3}$ or more and $1\times10^{22}$ cm$^{-3}$ or less.

6. The semiconductor device according to claim 1, wherein a gate length of the gate electrode is 170 nm or less.

7. The semiconductor device according to claim 1, further comprising an n-type impurity region provided between the first p-type impurity regions of the semiconductor layer, and the n-type impurity region having a carbon concentration lower than the carbon concentration of the portion.

8. The semiconductor device according to claim 1, wherein the second p-type impurity regions do not include germanium.

* * * * *